United States Patent
Harada

(10) Patent No.: US 10,446,791 B2
(45) Date of Patent: Oct. 15, 2019

(54) DISPLAY DEVICE

(71) Applicant: Japan Display Inc., Minato-ku (JP)

(72) Inventor: Keisuke Harada, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/970,033

(22) Filed: May 3, 2018

(65) Prior Publication Data

US 2018/0337365 A1 Nov. 22, 2018

(30) Foreign Application Priority Data

May 16, 2017 (JP) ................................. 2017-097024

(51) Int. Cl.
*H01L 51/52* (2006.01)
*H01L 51/56* (2006.01)
*H01L 27/32* (2006.01)

(52) U.S. Cl.
CPC ...... *H01L 51/5253* (2013.01); *H01L 27/3246* (2013.01); *H01L 27/3276* (2013.01); *H01L 51/56* (2013.01); *H01L 27/3244* (2013.01)

(58) Field of Classification Search
CPC ............. H01L 27/3244; H01L 27/3248; H01L 27/3246
See application file for complete search history.

(56) References Cited

U.S. PATENT DOCUMENTS

2003/0089991 A1* 5/2003 Yamazaki ........... H01L 27/3244
257/759
2015/0021565 A1 1/2015 Min et al.
2016/0093827 A1* 3/2016 Han ..................... H01L 51/5246
257/40

FOREIGN PATENT DOCUMENTS

JP 2015-023023 2/2015

* cited by examiner

*Primary Examiner* — Ermias T Woldegeorgis
(74) *Attorney, Agent, or Firm* — Oblon, McClelland, Maier & Neustadt, L.L.P.

(57) ABSTRACT

A display device according to an embodiment of the present invention includes a display panel which has a display area having a pixel array part including a plurality of pixels, a frame area arranged on an outer peripheral side of the display area, and a driving part formation area having a driving part which drives the pixel array part. The display panel includes: a substrate; an organic light-emitting diode; an organic insulating film which is provided in the display area and the frame area, and has an opening in a light-emitting area of the organic light-emitting diode; and a first inorganic insulating film formed on an upper surface of the organic insulating film in the frame area. The organic insulating film includes a plurality of pieces of organic insulating film which are divided in the frame area.

19 Claims, 8 Drawing Sheets

DISPLAY DEVICE

CROSS-REFERENCE TO RELATED APPLICATION

The present application claims priority from Japanese Application JP 2017-097024 filed on May 16, 2017, the content of which is hereby incorporated by reference into this application.

BACKGROUND OF THE INVENTION

1. Field of the Invention

One or more embodiments of the present invention relate to a display device.

2. Description of the Related Art

A flat panel display such as an organic electroluminescence (EL) display device has a display panel where a thin film transistor (a TFT), an organic light-emitting diode (an OLED) provided for each pixel, and the like are formed on a substrate.

Japanese Patent Application Laid-Open No. 2015-023023 discloses that an organic insulating film is provided which is formed along a border of pixels and has an opening in a light-emitting area of a pixel. This organic insulating film is formed also in a frame area provided outside the display area. In the frame area, a protective film is formed which includes an inorganic insulating film over the organic insulating film.

SUMMARY OF THE INVENTION

However, as to the conventional configuration as above, there is a possibility that a defect is generated on the organic EL layer included in the organic light-emitting diode. That is, in the conventional configuration as above, a vapor deposition mask used when forming an upper electrode and the organic EL layer included in the organic light-emitting diode touches an upper surface of the organic insulating film. Then, if a foreign substance which is attached to the vapor deposition mask is attached to the insulating film, a level difference is generated on the upper surface of the insulating film because of the existence of this foreign substance. Otherwise, a dent of the vapor deposition mask is generated on the upper surface of the insulating film, and a level difference is generated. Due to this level difference, there is a possibility that a defect is generated on the protective film formed thereafter. If a defect is generated on the protective film, moisture infiltrates through this defect, and the moisture reaches the organic EL layer of the organic light-emitting diode via the organic insulating film which is an organic material. As a result, there is a possibility that a defect is generated on the organic EL layer.

One or more embodiments of the present invention have been made in view of the problems as above, and the object thereof is to inhibit a generation of a defect in the organic EL layer.

1. A display device according to an embodiment of the present invention includes: a display panel which has a display area having a pixel array part including a plurality of pixels, a frame area arranged on an outer peripheral side of the display area, and a driving part formation area having a driving part which drives the pixel array part. The display panel includes: a substrate; an organic light-emitting diode including a lower electrode provided for each pixel over the substrate, an organic EL layer provided over the lower electrode, and an upper electrode provided over the organic EL layer; an organic insulating film which is provided in the display area and the frame area, and has an opening in a light-emitting area of the organic light-emitting diode; and a first inorganic insulating film formed on an upper surface of the organic insulating film in the frame area. The organic insulating film includes a plurality of pieces of organic insulating film which are divided in the frame area.

2. In the display device according to the above-mentioned item 1, the organic insulating film may include, in the frame area, the plurality of pieces of organic insulating film which extend from a side of the display area to a side of an edge of the frame area.

3. In the display device according to the above-mentioned item 1, the organic insulating film may include the plurality of pieces of organic insulating film which extend, in the frame area, to run along a border between the display area and the frame area.

4. In the display device according to the above-mentioned item 1, the organic insulating film may include the plurality of pieces of organic insulating film which are divided, in the frame area, in a direction from a side of the display area to a side of an edge of the frame area, and in a direction along a border between the display area and the frame area.

5. The display device according to any one of the above-mentioned items 1 to 4 may further include: a planarizing film provided over the substrate; and a second inorganic insulating film provided over the planarizing film and under the organic insulating film. In the frame area, the second inorganic insulating film may have a plurality of openings.

6. In the display device according to the above-mentioned item 5, in the frame area, at least a part of the pieces of organic insulating film may fill up the opening.

7. In the display device according to the above-mentioned item 6, the organic insulating film may include: the pieces of organic insulating film which fill up the openings; and the piece of organic insulating film which does not fill up the openings. The piece of organic insulating film which does not fill up the openings may be interposed between the plurality of pieces of organic insulating film which fill up the openings.

8. In the display device according to any one of the above-mentioned items 5 to 7, between the plurality of pieces of organic insulating film in the frame area, a lower surface of the upper electrode and an upper surface of the conductive film may be electrically connected.

9. In the display device according to the above-mentioned item 8, there may be a contact region where the lower surface of the upper electrode and the upper surface of the conductive film are electrically connected, and the contact region on a side distant from the driving part formation area may be larger than the contact region on a side close to the driving part formation area.

10. In the display device according to the above-mentioned item 8, widths of the pieces of organic insulating film on a side distant from the driving part formation area may be narrower than widths of the pieces of organic insulating film on a side close to the driving part formation area.

11. In the display device according to the above-mentioned item 8, arrangement intervals of the plurality of pieces of organic insulating film on a side distant from the driving part formation area may be wider than arrangement intervals of the plurality of pieces of organic insulating film on a side close to the driving part formation area.

12. In the display device according to any one of the above-mentioned items 1 to 11, the lower electrode and the conductive film may be formed of a same material.

13. In the display device according to any one of the above-mentioned items 1 to 12, a size of a formation area of the organic insulating film in the frame area may be 80% or less of a total size of the frame area.

14. In the display device according to any one of the above-mentioned items 1 to 13, a size of a formation area of the organic insulating film in the frame area may be 65% or less of a total size of the frame area.

15. In the display device according to any one of the above-mentioned items 1 to 14, a size of a formation area of the organic insulating film in the frame area may be 30% or more of a total size of the frame area.

DETAILED DESCRIPTION OF THE INVENTION

First Embodiment

Figure 1:
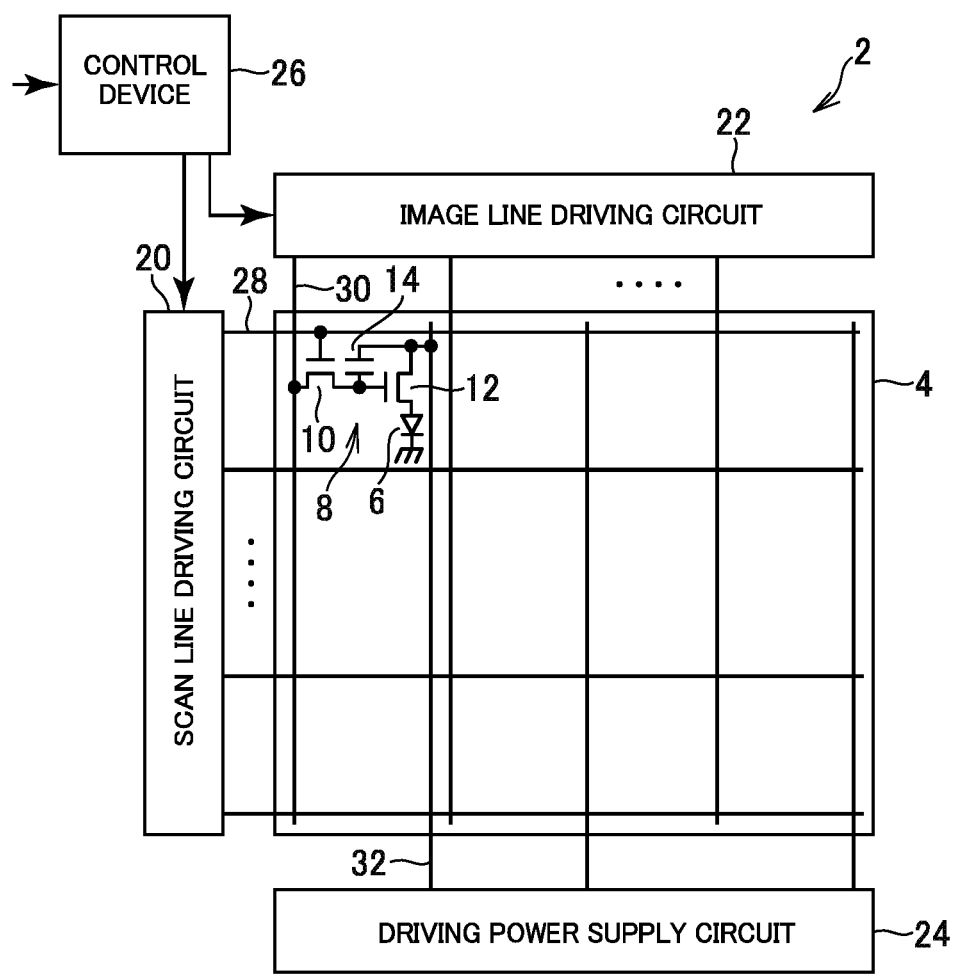
FIG. 1 is a schematic view of a schematic configuration of a display device according to a present embodiment.

Below, one or more embodiments of the present invention is explained with reference to the accompanying drawings.

Note that the disclosed embodiments are merely examples, and an appropriate variation which a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those which have already been illustrated in another drawing, and a detailed explanation of such elements may be omitted as appropriate. Further, unless otherwise noted, embodiments of the present invention can be combined with one another.

A display device 2 according to the present embodiment is, for example, an organic electroluminescence display device, and is loaded on a TV, a personal computer, a mobile terminal, a cellular phone, and the like. FIG. 1 is a schematic view of a configuration of the display device 2 according to the present embodiment. The display device 2 is equipped with a pixel array part 4 for displaying an image, and a driving part which drives the pixel array part 4. The display device 2 may have a base material made of glass or the like. The display device 2 may be a flexible display having flexibility, and in such a case the display device 2 may have a base material made of a resin film having flexibility. The display device 2 has a wiring layer including a wiring arranged inside or over the base material.

On the pixel array part 4, an organic light-emitting diode 6 and a pixel circuit 8 are arranged in a matrix form corresponding to pixels. The pixel circuit 8 includes a lighting TFT (thin film transistor) 10, a driving TFT 12, a capacitor 14, and the like.

Meanwhile, the driving part includes a scan line driving circuit 20, an image line driving circuit 22, a driving power supply circuit 24, and a control device 26, drives the pixel circuit 8, and controls light emission of the organic light-emitting diode 6.

The scan line driving circuit 20 is connected to a scan signal line 28 provided for each horizontal line of pixels (pixel rows). In accordance with timing signals input from the control device 26, the scan line driving circuit 20 selects scan signal lines 28 in order, and applies a voltage for turning on the lighting TFT 10 to the selected scan signal lines 28.

The image line driving circuit 22 is connected to an image signal line 30 provided for each vertical line of pixels (pixel column). The image line driving circuit 22 receives an image signal from the control device 26, and in accordance with the selection of the scan signal line 28 by the scan line driving circuit 20, outputs a voltage corresponding to an image signal of the selected pixel row to each image signal line 30. The voltage is written into the capacitor 14 via the lighting TFT 10 in the selected pixel row. The driving TFT 12 supplies an electric current corresponding to the written voltage to the organic light-emitting diode 6, and thus the light-emitting diode 6 of a pixel corresponding to the selected scan signal line 28 emits light.

The driving power supply circuit 24 is connected to a driving power supply line 32 provided for each pixel column, and supplies an electric current to the organic light-emitting diode 6 via the driving electric power supply line 32 and the driving TFT 12 of the selected pixel row.

Here, a lower electrode of the organic light-emitting diode 6 is connected to the driving TFT 12. On the other hand, an upper electrode of each organic light emitting diode 6 is composed of an electrode shared in common by the organic light-emitting diodes 6 of all the pixels. In a case where the lower electrode is configured as an anode, a high electric potential is input thereto, and the upper electrode becomes a cathode and a low electric potential is input thereto. In a case where the lower electrode is configured as a cathode, a low electric potential is input thereto, and the upper electrode becomes an anode and a high electric potential is input thereto.

Figure 2:
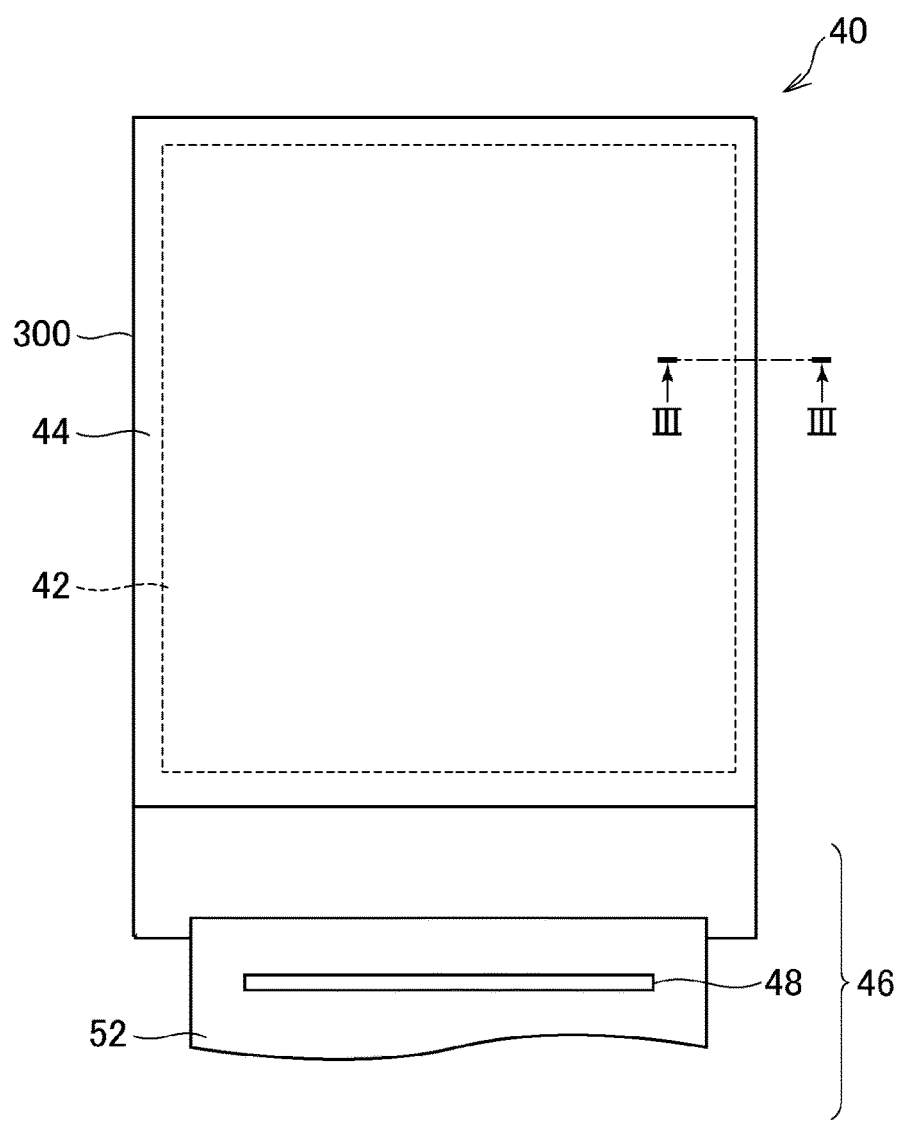
FIG. 2 is a schematic plan view of a display panel of the display device according to the present embodiment.

FIG. 2 is a schematic plan view of the display panel 40 according to the present embodiment. The display panel 40 has a display area 42 where the organic light emitting diodes 6 provided in the pixel array part 4 are arranged, and a frame area 44 arranged on the external periphery side thereof.

As illustrated in FIG. 2, to an organic light-emitting diode structure layer 300 including the organic light-emitting diodes 6, an FPC (flexible printed circuits) 52 is connected, and on this FPC 52, a driver IC 48 which constitutes the driving part described above is mounted. The FPC 52 is connected to the scan line driving circuit 20, the image line driving circuit 22, the driving power supply circuit 24, and the control device 26 which have been described above, and the like, and on the FPC 52, an IC is mounted.

Figure 3:
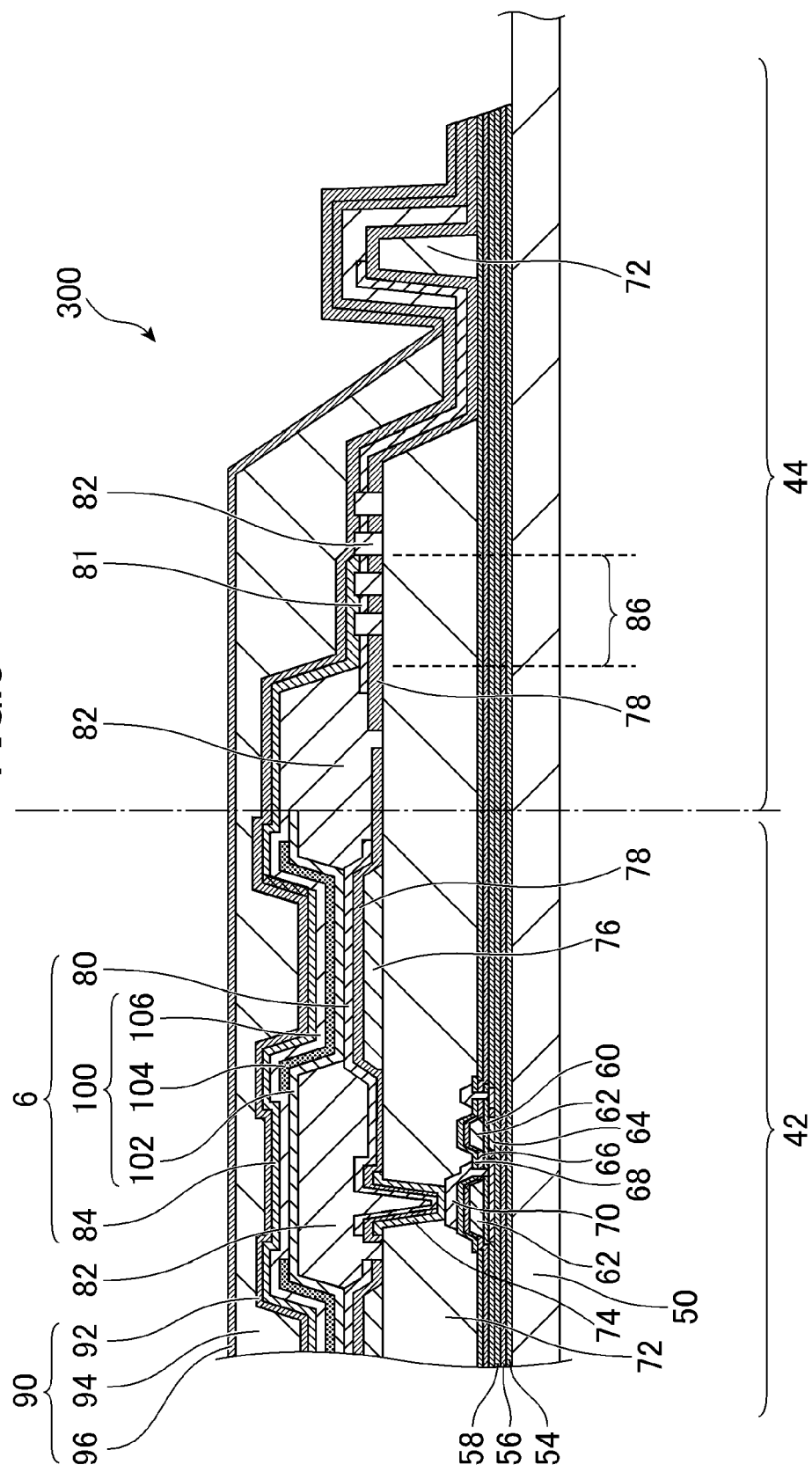
FIG. 3 is a schematic vertical cross sectional view of a display panel at a position along III-III line in FIG. 2.

FIG. 3 is a schematic view of a vertical cross section of the display panel 40 along line of FIG. 2, that is, a cross section of an area ranging from a part of the display area 42 to the frame area 44. As illustrated in FIG. 3, the display panel 40 of the present embodiment has an array substrate 50. In the present embodiment, polyimide is used as a material which constitutes the array substrate 50. Note that another resin material can be used as the material which constitutes the array substrate 50.

On the array substrate 50, a three-layer lamination structure is provided which includes a first silicon oxide film 54, a first silicon nitride film 56, and a second silicon oxide film 58, as an undercoat layer. The first silicon oxide film 54 as the lowermost layer is provided for improving adhesiveness with the array substrate 50, the first silicon nitride film 56 as the middle layer is provided as a blocking film against moisture and impurities from the outside, and the second silicon oxide film 58 as the uppermost layer is provided as a blocking film for suppressing diffusion of hydrogen atoms included in the first silicon nitride film 56 toward a semiconductor layer side, respectively. Note that the undercoat layer is not specifically limited to this structure, but can be a structure having a further lamination, and can be a single-layer structure or a two-layer structure as well.

Over the undercoat layer, the driving TFT 12 is provided. The driving TFT 12 has a structure where a low density impurity area is provided between a channel area and a source/drain area. In the present embodiment, a silicon oxide film is used as the gate insulating film 60, and a first wiring 62 composed of a lamination structure of Ti and Al is used as a gate electrode. The first wiring 62 functions as the gate electrode of the driving TFT 12, and additionally, functions as a holding capacitor line. That is, the first wiring 62 is used for forming a holding capacitor between the first wiring 62 and a polysilicon film 64.

Over the driving TFT 12, a second silicon nitride film 66 and a third silicon oxide film 68 to be an interlayer insulating film are laminated respectively, and moreover source/drain electrodes and a second wiring 70 to be a routing wiring are formed. In the present embodiment, the second wiring 70 is configured to have three-layer lamination structure of Ti, Al, and Ti. The holding capacitor is formed by the interlayer insulating film and an electrode formed of a conductive layer positioned in the same layer where the first wiring 62 is positioned, and an electrode formed of a conductive layer positioned in the same layer where the source/drain wirings of the driving TFT 12 is positioned. The routing wiring is extended to an edge of a periphery of the array substrate 50, and forms a terminal to be connected to the FPC 52 and the driver IC 48 illustrated in FIG. 2.

Over the driving TFT 12, a planarizing film 72 is formed. As the planarizing film 72, an organic material such as a photosensitive acryl is often used. The planarizing film 72 is superior in flatness of the surface as compared with an inorganic insulating material formed by the CVD (chemical vapor deposition) method or the like.

The planarizing film 72 is removed at a pixel contact part where the driving TFT 12 and a lower electrode 80 included in the organic light-emitting diode 6 are electrically connected to each other and at an edge part of the frame area 44. At the pixel contact part, an upper surface of the second wiring 70 which is exposed by removing the planarizing film 72, is covered by a transparent conductive film 74 made of ITO (Indium Tin Oxide).

Subsequently, in the same layer where the transparent conductive film 74 is positioned, a third wiring 76 is provided. In the present embodiment, this third wiring 76 is provided as three-layer lamination structure composed of Mo, Al, and Mo, and is used for forming the routing wiring in the vicinity and a capacitor element additionally provided in the pixel. Covering, by the transparent conductive film 74, the upper surface of the second wiring 70 which has been exposed after removing the planarizing film 72 also has a purpose of protecting the exposed surface of the second wiring 70 from a patterning process of the third wiring 76.

The upper surfaces of the transparent conductive film 74 and the third wiring 76 are temporarily covered by the third silicon nitride film 78 (the second inorganic insulating film in the present disclosure). Thereafter, in the vicinity of the pixel contact part of the transparent conductive film 74 in the display area 42, an opening is provided in the third silicon nitride film 78, and a part of the upper surface of the transparent conductive material 74 is exposed. Further, in the present embodiment, also in the frame area 44, a plurality of openings are provided in the third silicon nitride film 78, and in the respective openings, the upper side of the planarizing film 72 is exposed.

Thereafter, the lower electrode 80 as the pixel electrode is formed so as to be connected to the upper surface of the transparent conductive film 74 which is exposed in the opening. In the present embodiment, the lower electrode 80 is formed as a reflecting electrode, and has a three-layer lamination structure formed of IZO, Ag, and IZO. In the pixel contact part, an additional capacitor is formed by the transparent conductive film 74, the third silicon nitride film 78, and the lower electrode 80. Now, when patterning the lower electrode 80 the transparent conductive film 74 is partially exposed to an etching environment, but by an annealing treatment performed after a formation process of the transparent conductive film 74 and before a formation process of the lower electrode 80, the conductive transparent film 74 becomes resistant to an etching of the lower electrode 80.

In the present embodiment, when forming this lower electrode 80, in the frame area 44, a conductive film 81 made of the same conductive material which is used for forming the lower electrode 80 is formed over the third silicon nitride film 78. As explained above, in the frame area 44, the third silicon nitride film 78 has the plurality of openings, and the conductive film 81 is not formed over those openings. That is, the conductive film 81 has a plurality of openings corresponding to the openings of the third silicon nitride film 78, and the upper surface of the planarizing film 72 is exposed in the plurality of openings.

Those openings are provided in order to let moisture and gas out which are desorbed from the planarizing film 72 via the organic insulating film 82, by a heat treatment or the like after the formation process of the organic insulating film 82. Therefore, as shown in the present embodiment, by adopting a configuration to provide a plurality of openings not only in the display area 42 but in the frame area 44 also, it becomes possible to efficiently remove moisture and gas desorbed from the planarizing film 72 in the frame area 44.

Note that it is fine to choose, as a conductive material used for the conductive film 81, a conductive material other than the one used for the lower electrode 80, but it is preferable to choose the same material as the one used for the lower electrode 80, as the conductive film 81 and the lower electrode 80 can be formed simultaneously.

After the formation process of the lower electrode 80, an organic insulating film 82 is formed, which is called a bank or a rib and works as a separating wall of a pixel area. As the organic insulating film 82, photosensitive acryl or the like is used, as used for the planarizing film 72. It is preferable that an opening is formed in the organic insulating film 82 so that the upper surface of the lower electrode 80 is exposed as the light-emitting area and the edge of the opening has a gently tapered shape. If the edge of the opening has a steep shape, a coverage defect of the organic EL layer 100 which is formed later occurs.

Here, in the present embodiment, so as to fill up the plurality of openings provided in the conductive film 81 and the third silicon nitride film 78 in the frame area 44, the organic insulating film 82 is formed. That is, as illustrated in FIG. 3, it is configured that a part of the organic insulating film 82 enters into the openings. Formation of the organic insulating film 82 so as to fill up the openings of the third silicon nitride film 78 can suppress a dissolution of an inner peripheral surface of the openings of the third silicon nitride film 78 in a later process.

A specific shape of this organic insulating film 82 in the frame area 44 will be described later.

After forming the organic insulating film 82, an organic material which constitutes the organic EL layer 100 is laminated and formed. As a lamination structure which constitutes the organic EL layer 100, a hole transport layer 102, a light-emitting layer 104, and an electron transport layer 106 are laminated and formed in order, starting from a side of the lower electrode 80. In the present embodiment, the hole transport layer 102 and the electron transport layer 106 are formed over a plurality of subpixels, and the light emitting layer 104 is formed separately for each subpixel. The organic EL layer 100 may be formed by vaper deposition, and may be formed by coating formation after solvent dispersion. Further, the organic EL layer 100 may be formed for each subpixel selectively, and may be formed over the whole display area 42 like a layer. If the organic EL layer 100 is formed like a layer, it may be configured that all the subpixels receive white light, and a color filter (not shown) extracts a desired wavelength portion therefrom. In the present embodiment, the configuration is adopted where the organic EL layer 100 is formed for each subpixel selectively.

After forming the organic EL layer 100, an upper electrode 84 is formed. Since the top emission structure is adopted in the present embodiment, the upper electrode 84 is formed using a transparent conductive material, such as IZO (Indium Zinc Oxide). According to the formation order of the organic EL layer 100 described above, the lower electrode 80 becomes an anode, and the upper electrode 84 becomes a cathode. The upper electrode 84, the organic EL layer 100, and the lower electrode 80 as these constitute the organic light-emitting diode 6. The lower electrode 80 of the organic light-emitting diode 6 is connected to the driving TFT 12.

After forming the upper electrode 84, a protection layer 90 is formed. One of the functions of the protection layer 90 is to prevent an infiltration of moisture into the organic EL layer 100 formed earlier from the outside, and the protection layer 90 is required to have a high gas-barrier property. In the present embodiment, as a lamination structure of the protection layer 90, a lamination structure of a fourth silicon nitride film 92 (the first inorganic insulating film in the present disclosure), an organic resin film 94 made of acrylic resin or the like, and a fifth silicon nitride film 96 is adopted.

Further, it may be configured that a silicon oxide film is interposed between the organic resin film 94 and the fifth silicon nitride film 96.

Below, with reference to FIG. 4-FIG. 8, the shape of the organic insulating film 82 formed in the frame area 44 is explained.

Figure 4:
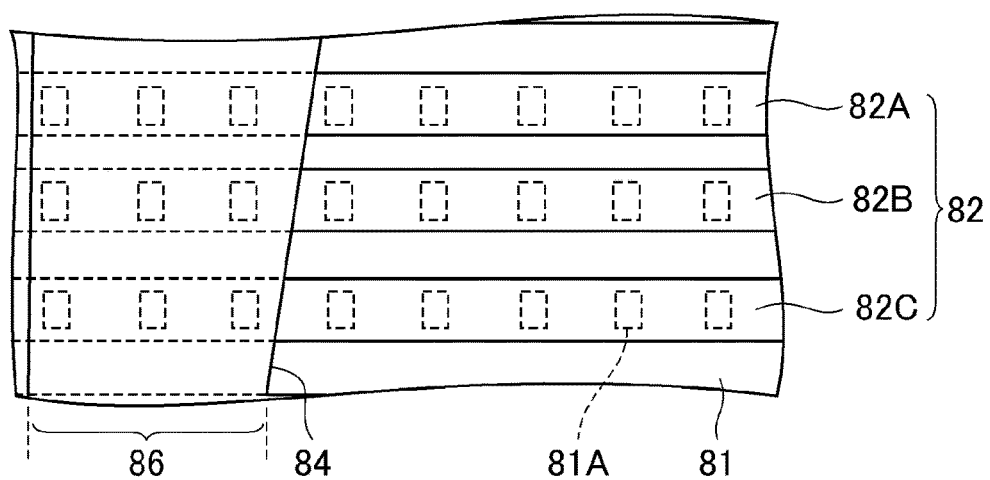
FIG. 4 is a schematic plan view of a shape of an organic insulating film in a frame area of a display device according to one example of the present embodiment.

FIG. 4 is a schematic plan view of the shape of the organic insulating film 82 in the frame area 44 of the display device 2 according to one example of the present embodiment.

As illustrated in FIG. 4, the organic insulating film 82 in the frame area 44 is divided into a plurality of pieces of organic insulating film 82A, 82B, and 82C which extend from the side of the display area 42 to the side of an edge of the frame area 44. A slit is formed between a piece of organic insulating film 82A and a piece of organic insulating film 82B, and between a piece of organic insulating film 82B and a piece of organic insulating film 82C, and the upper surface of the conductive film 81 is exposed. As described above, in the conductive film 81, the plurality of openings 81A are provided, and the pieces of organic insulating film 82A, 82B, and 82C fill up the respective openings 81A.

Like this, the organic insulating film 82 illustrated in FIG. 4 is divided into the plurality of pieces of organic insulating film 82A, 82B, and 82C, and a slit is formed between a piece of organic insulating film 82A and a piece of organic insulating film 82B, and between a piece of organic insulating film 82B and a piece of organic insulating film 82C. Therefore, a part of the vapor deposition mask used when forming the organic EL layer 100 or the upper electrode 84 included in the organic light-emitting diode 6 touching the upper surface of the organic insulating film 82 can be made smaller. As a result, the possibility that a foreign object is attached to the upper surface of the organic insulating film 82 and the possibility a dent of the vapor deposition mask is generated can be lowered, and a generation of a level difference on the upper surface of the organic insulating film 82 can be suppressed. As such, the possibility can be lowered that a defect is generated due to this level difference on the fourth silicon nitride film 92 formed thereafter as the inorganic insulating film. As a result, the risk of moisture infiltration from the side of the protection layer 90 can be lowered, and the generation of a defect in the organic EL layer 100 can be suppressed.

Here, in view of the suppression of the defect generation in this organic EL layer 100, it is preferable to make the size of the formation area of the organic insulating film 82 in the frame area 44 to be 80% or less of the size of the whole frame area 44, and it is more preferable to make it 65% or less.

However, the organic insulating film 82 in the frame area 44 functions as a buffer agent against the vapor deposition mask, and functions to protect the conductive film 81 which is an under-layer, and therefore the organic insulating film 82 preferably constitutes 30% or more of the size of the whole frame area 44.

Note that as illustrated in FIG. 3 and FIG. 4, over the conductive film 81 and over the organic insulating film 82, a part of the upper electrode 84 to be described later is provided, and the upper surface of the conductive film 81 and the lower surface of the upper electrode 84 electrically contact each other in the slit regions where the organic insulating film 82 is not formed. According to this configuration, it becomes possible to route an electric current from the upper electrode 84 to an edge of the frame area 44.

By adjusting the contact area of the conductive film 81 and the upper electrode 84, it becomes possible to adjust a resistance value as appropriate. As to a method of adjusting the contact area of the conductive film 81 and the upper electrode 84, for example, if an area is increased where the organic insulating film 82 is formed, the contact area can be decreased. Further, if an area is decreased where the organic insulating film 82 is formed and the area of the slits are increased, the contact area can be increased. Also, by varying a width of a contact region 86 where the conductive film 81 and the upper electrode 84 can contact each other as illustrated in FIG. 4, the contact area of the conductive film 81 and the upper electrode 84 can be adjusted.

As to the example illustrated in FIG. 4, the contact resistance can be decreased by setting the width of the contact region 86 on the side distant from the driving part formation area 46 to be more than the width of the contact region 86 on the side close to the driving part formation area 46. This effect can be obtained also by making the formation area of the piece of the organic insulating film 82A on the side distant from the driving part formation area 46 to be smaller than the formation area of the piece of the organic insulating film 82C on the side close to the driving part formation area 46. The adjustment of the formation areas of the pieces of organic insulating film 82A, 82B, and 82C can be made by adjusting the widths of the pieces of organic insulating film 82A, 82B, and 82C, for example. Further, the contact resistance can be decreased also by setting a space between the pieces of organic insulating film 82A and 82B adjacent to each other to be larger than a space between the pieces of organic insulating film 82B and 82C.

Figure 5:
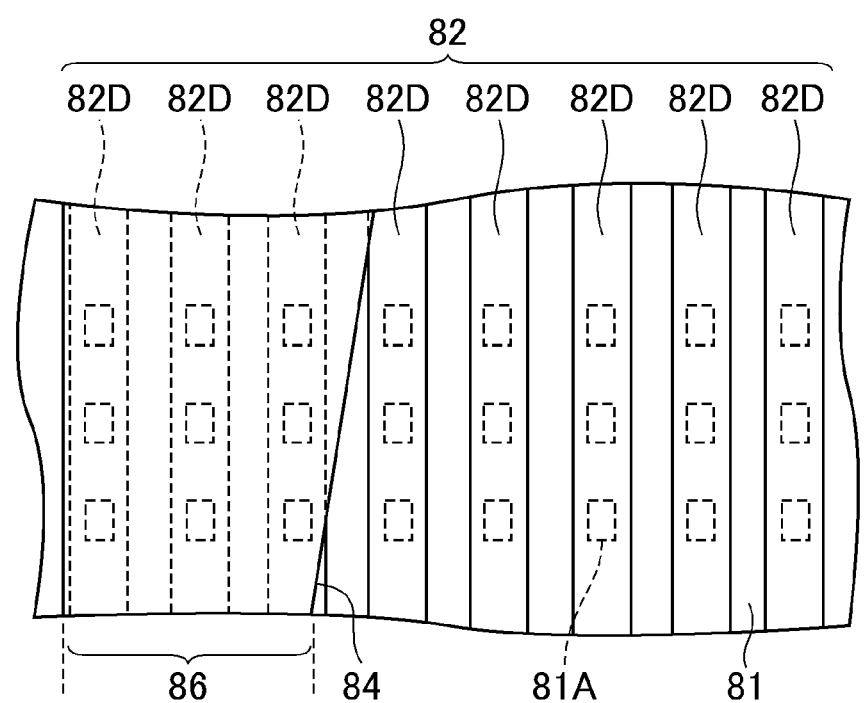
FIG. 5 is a schematic plan view of a shape of an organic insulating film in a frame area of a display device according to one example of the present embodiment.

FIG. 5 is a schematic plan view of the shape of the organic insulating film 82 in the frame area 44 of the display device 2 according to one example of the present embodiment.

As to the example illustrated in FIG. 5, the organic insulating film 82 in the frame area 44 is divided into a plurality of pieces of organic insulating film 82D which extend so as to run along the border between the display area 42 and the frame area 44. A space between the pieces of organic insulating film 82D is a slit, where the upper surface of the conductive film 81 is exposed. As described above, the plurality of openings 81A are provided in the conductive film 81, and the respective organic insulating films 82D fills up the respective openings 81A.

As to the configuration illustrated in this FIG. 5, as in the configuration described as above with reference to FIG. 4, a part of the vapor deposition mask used when forming the organic EL layer 100 or the upper electrode 84 included in the organic light-emitting diode 6 touching the upper surface of the organic insulating film 82 can be made smaller. As a result, the possibility that a foreign object is attached to the upper surface of the organic insulating film 82 and the possibility a dent of the vapor deposition mask is generated can be lowered, and a generation of a level difference on the upper surface of the organic insulating film 82 can be suppressed. As such, the possibility can be lowered that a defect is generated due to this level difference on the fourth silicon nitride film 92 formed thereafter as the inorganic insulating film. As a result, the risk of moisture infiltration from the side of the protection layer 90 can be lowered, and the generation of a defect in the organic EL layer 100 can be suppressed.

Further, in the example illustrated in FIG. 5, as in the configuration described as above with reference to FIG. 4, a size of the area can be adjusted where the conductive film 81 and the upper electrode 84 contact each other.

Further, in the example illustrated in FIG. 5, it is possible to appropriately adjust a difference of the contact area of the conductive film 81 and the upper electrode 84 on the side of the display area 42 and the contact area thereof on the side of the edge of the frame area 44. That is, in the example illustrated in FIG. 5, the plurality of pieces of organic insulating film 82D extend to run along the border between the display area 42 and the frame area 44. Therefore, by differentiating the widths of pieces of organic insulating film 82D disposed on the side of the display area 42 from the widths of pieces of organic insulating film 82D disposed on the side of the edge of the frame area 44, it becomes possible to appropriately adjust the difference of the contact areas of the conductive film 81 and the upper electrode 84.

Further, as the example illustrated in this FIG. 5, since the organic insulating film 82 is divided into the plurality of pieces of organic insulating film 82D which extend to run along the border between the display area 42 and the frame area 44, and it becomes possible to further reduce the risk of moisture infiltration into the organic EL layer 100. That is, the organic insulating film 82 has a high affinity to moisture as it is made of an organic material, and therefore there is a risk that the organic insulating film 82 itself becomes a passage of moisture. However, as the example illustrated in this FIG. 5, since the organic insulating film 82 is divided into the plurality of pieces of organic insulating film 82D which extend to run along the border between the display area 42 and the frame area 44 and they cut off the passage through which moisture of the frame area 44 is transmit to the side of display area 42. As a result, it becomes possible to further reduce the risk of moisture infiltration into the organic EL layer 100.

Figure 6:
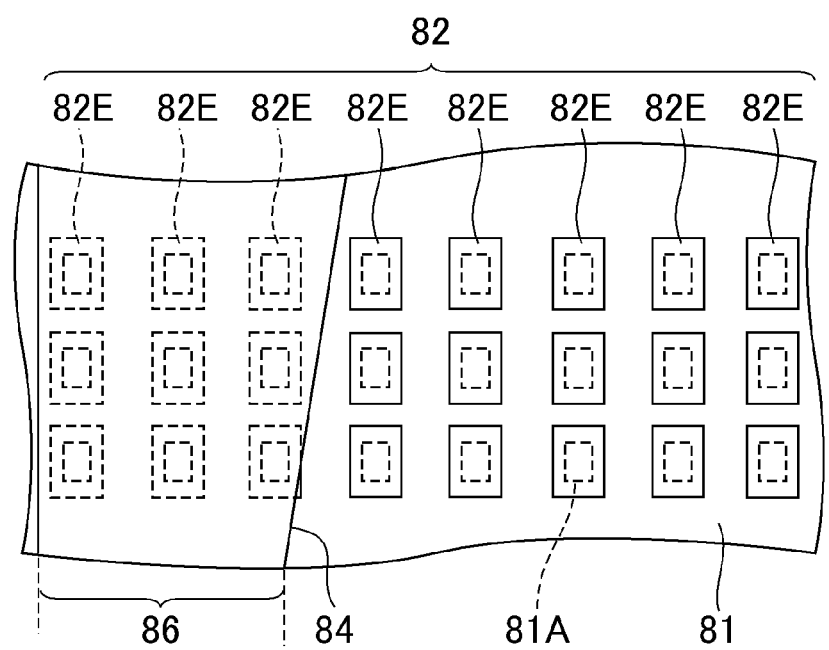
FIG. 6 is a schematic plan view of a shape of an organic insulating film in a frame area of a display device according to one example of the present embodiment.

FIG. 6 is a schematic plan view of the shape of the organic insulating film 82 in the frame area 44 of the display device 2 according to one example of the present embodiment.

In the example illustrated in FIG. 6, the organic insulating film 82 in the frame area 44 are divided in the direction from the side of the display area 42 to the side of the edge of the frame area 44 and in the direction to run along the border between the display area 42 and the frame area 44, and a plurality of pieces of organic insulating film 82E are aligned vertically and horizontally. Between the respective pieces of organic insulating film 82E, the upper surface of the conductive film 81 is exposed. As described above, the plurality of openings 81A are provided in the conductive film 81, and the respective pieces of organic insulating film 82E fill up the respective openings 81A.

Also in the configuration illustrated in this FIG. 6, as in the configurations as described above with reference to FIG. 4 and FIG. 5, a part of the vapor deposition mask used when forming the organic EL layer 100 or the upper electrode 84 included in the organic light-emitting diode 6 touching the upper surface of the organic insulating film 82 can be made smaller. As a result, the possibility that a foreign object is attached to the upper surface of the organic insulating film 82 and the possibility a dent of the vapor deposition mask is generated can be lowered, and a generation of a level difference on the upper surface of the organic insulating film 82 can be suppressed. As such, the possibility can be lowered that a defect is generated due to this level difference on the fourth silicon nitride film 92 formed thereafter as the inorganic insulating film. As a result, the risk of moisture infiltration from the side of the protection layer 90 can be lowered, and the generation of a defect in the organic EL layer 100 can be suppressed.

Further, in the example illustrated in FIG. 6, as in the configurations described as above with reference to FIG. 4 and FIG. 5, a size of an area can be adjusted where the conductive film 81 and the upper electrode 84 contact each other. In particular, the example illustrated in FIG. 6 has a high degree of freedom with respect to the adjustment of the contact area as compared with the examples illustrated FIG. 4 and FIG. 5, since by appropriately differentiating the sizes of pieces of organic insulating film 82E aligned vertically and horizontally, it becomes possible to appropriately adjust a difference of the contact areas of the conductive film 81 and the upper electrode 84.

Further, in the example illustrated in FIG. 6, as in the example illustrated in FIG. 5, since the organic insulating film 82 is divided so as to run along the border between the display area 42 and the frame area 44 and cut off the passage through which moisture of the frame area 44 is transmit to the side of the display area 42. As a result, it becomes possible to further reduce the risk of moisture infiltration into the organic EL layer 100.

Figure 7:
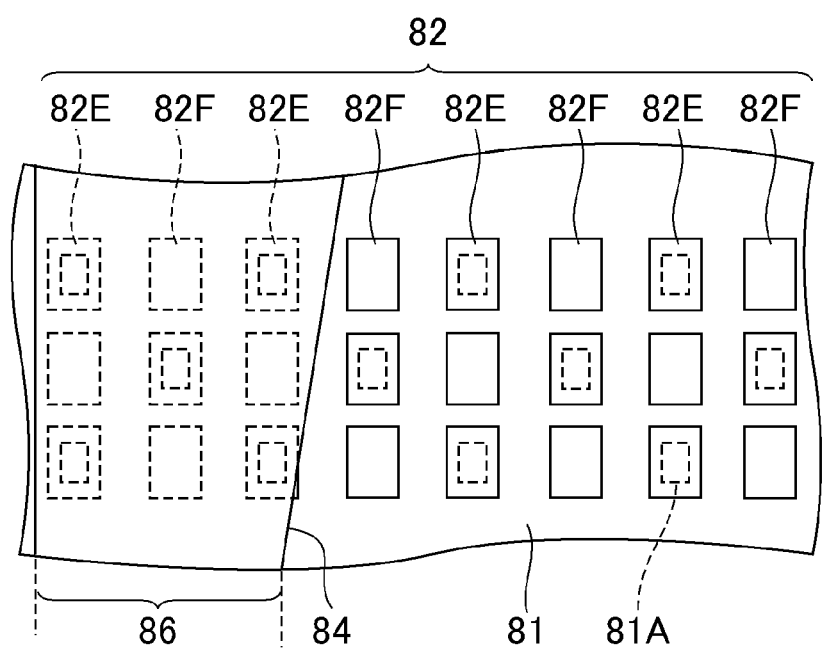
FIG. 7 is a schematic plan view of a shape of an organic insulating film in a frame area of a display device according to one example of the present embodiment.

FIG. 7 is a schematic plan view of the shape of the organic insulating film 82 in the frame area 44 of the display device 2 according to one example of the present embodiment.

The example illustrated in FIG. 7 is similar to the example as described above with reference to FIG. 6, but is a configuration where the piece of organic insulating film 82E which fills up the opening 81A of the conductive film 81 and a piece of organic insulating film 82F which does not fill up the opening 81A of the conductive film 81 coexist. Note that in the example illustrated in FIG. 7, it is configured that the piece of organic insulating film 82F which does not fill up the opening 81A of the conductive film 81 is interposed between the plurality of pieces of organic insulating film 82E which fill up the openings 81A of the conductive film 81.

According to such a configuration, the effect, due to the existence of the openings 81A, of letting moisture go upward from the side of the planarizing film 72 and the effect of suppressing the moisture infiltration into the planarizing film 72 from the side of the protection layer 90 can go together. That is, as described above, in view of protecting the conductive film 81 which is an under-layer, a certain number and a certain area of pieces of organic insulating film 82E/82F are necessary. However, not by configuring to arrange, under all of the pieces of organic insulating film 82E/82F, the opening 81A to let moisture go from the side of the planarizing film 72, but by arranging, thereunder, the conductive film 81 which has no opening 81A, it becomes possible to suppress moisture infiltration from the side of the protection layer 90 to the side of the planarizing film 72.

Further, with the configuration where a piece of organic insulating film 82E and a piece of organic insulating film 82F do not contact each other, moisture infiltrated from the side of protection layer 90 can be prevented from infiltrating into the piece of organic insulating film 82E via the piece of organic insulating film 82F. As a result, infiltration of moisture into the side of the planarizing film 72 can be suppressed.

Figure 8:
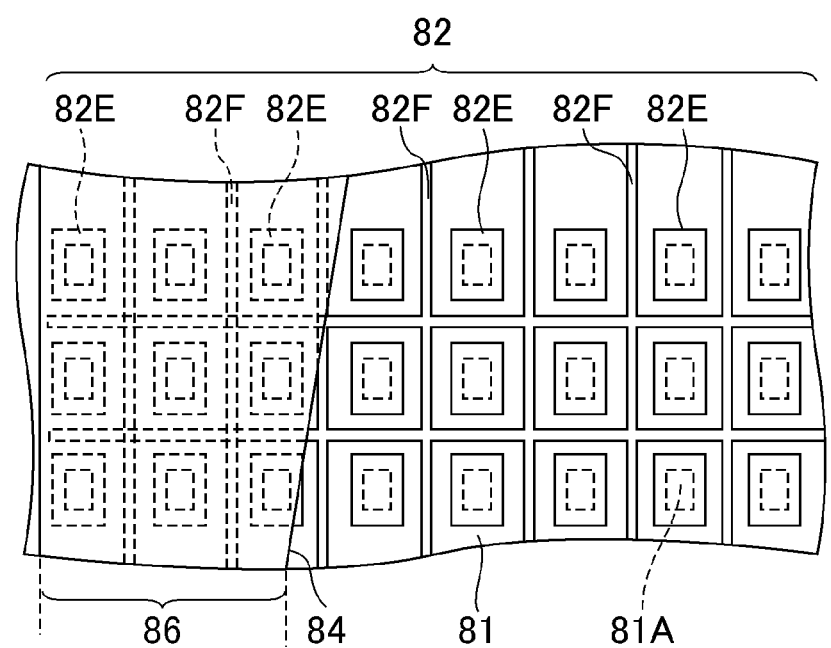
FIG. 8 is a schematic plan view of a shape of an organic insulating film in a frame area of a display device according to one example of the present embodiment.

As another example of the configuration where the pieces of organic insulating film 82E which fill up the openings 81A of the conductive film 81 and pieces of organic insulating film 82F which do not fill up the openings 81A of the conductive film 81 coexist, as illustrated in FIG. 8, it may be configured to dispose lattice-like pieces of organic insulating film 82F which surrounds the respective pieces of organic insulating film 82E.

As the configuration illustrated in FIG. 7 and FIG. 8, by configuring that the piece of organic insulating film 82F which does not fill up the openings 81A is interposed between the plurality of pieces of organic insulating film 82E which fill up the openings 81A, the two effects, namely, the effect of letting moisture go upward from the side of the planarizing film 72 and the effect of suppressing the moisture infiltration into the planarizing film 72 from the side of the protection layer 90, the two effects can be well-balanced in the respective areas and can go together, which is preferable.

It is understood that without departing from the spirit of the present invention, those skilled in the art can arrive at various kinds of variations and modifications, and such variations and modifications belong to the scope of the present invention. For example, each of the embodiments as described above to which addition, deletion, or design change of components, or addition, omission, or condition change of processes is suitably applied by those skilled in the art are also encompassed within the scope of the present invention as long as they fall within the spirit of the present invention.

What is claimed is:

1. A display device comprising:
 a display panel which has a display area having a pixel array part including a plurality of pixels, a frame area arranged on an outer peripheral side of the display area, and a driving part formation area having a driving part which drives the pixel array part,
 the display panel comprises:
 a substrate;
 an organic light-emitting diode including a lower electrode provided for each pixel over the substrate, an organic EL layer provided over the lower electrode, and an upper electrode provided over the organic EL layer;
 an organic insulating film which is provided in the display area and the frame area, and has an opening in a light-emitting area of the organic light-emitting diode;
 a first inorganic insulating film formed on an upper surface of the organic insulating film in the frame area;
 a planarizing film provided over the substrate; and
 a second inorganic insulating film provided over the planarizing film and under the organic insulating film, wherein
 the second inorganic insulating film includes a plurality of openings in the frame area,
 the organic insulating film includes a plurality of pieces of organic insulating film which are separated each other in the frame area,
 one of the plurality of pieces of organic insulating film and the planarizing film are in contact each other via one of the plurality of openings of the second inorganic insulating film, and
 another one of the plurality of pieces of organic insulating film and the planarizing film are in contact each other via another one of the plurality of openings of the second inorganic insulating film.

2. The display device according to claim 1, wherein
 in the frame area, the one and the another one of the plurality of pieces of organic insulating film fill up the one and the another one of the plurality of openings of the second inorganic insulating film respectively.

3. The display device according to claim 2, wherein
 still another one of the plurality of pieces of the organic insulating film does not fill up any of the plurality of openings of the second inorganic insulating film, and
 the still another one of the plurality of pieces of the organic insulating film is between the one of the plurality of pieces of the organic insulating film and the another one of the plurality of pieces of the organic insulating film.

4. The display device according to claim 1, wherein
 between the plurality of pieces of organic insulating film in the frame area, a lower surface of the upper electrode and an upper surface of a conductive film provided over the second inorganic insulating film are electrically connected.

5. The display device according to claim 4, wherein
there is a contact region where the lower surface of the upper electrode and the upper surface of the conductive film are electrically connected, and
the contact region on a side distant from the driving part formation area is larger than the contact region on a side close to the driving part formation area.

6. The display device according to claim 4, wherein
widths of the pieces of organic insulating film on a side distant from the driving part formation area are narrower than widths of the pieces of organic insulating film on a side close to the driving part formation area.

7. The display device according to claim 4, wherein
arrangement intervals of the plurality of pieces of organic insulating film on a side distant from the driving part formation area are wider than arrangement intervals of the plurality of pieces of organic insulating film on a side close to the driving part formation area.

8. The display device according to claim 4, wherein
the lower electrode and the conductive film are formed of a same material.

9. The display device according to claim 1, wherein
the organic insulating film includes, in the frame area, the plurality of pieces of organic insulating film which extend from a side of the display area to a side of an edge of the frame area.

10. The display device according to claim 1, wherein
the organic insulating film comprises the plurality of pieces of organic insulating film which extend, in the frame area, to run along a border between the display area and the frame area.

11. The display device according to claim 1, wherein
the organic insulating film comprises the plurality of pieces of organic insulating film which are divided, in the frame area, in a direction from a side of the display area to a side of an edge of the frame area, and in a direction along a border between the display area and the frame area.

12. The display device according to claim 1, wherein
a size of a formation area of the organic insulating film in the frame area is 80% or less of a total size of the frame area.

13. The display device according to claim 1, wherein
a size of a formation area of the organic insulating film in the frame area is 65% or less of a total size of the frame area.

14. The display device according to claim 1, wherein
a size of a formation area of the organic insulating film in the frame area is 30% or more of a total size of the frame area.

15. A display device including a display area and a frame area around the display area, the display device comprising:
a substrate;
a planarizing film on the substrate;
a lower electrode on the planarizing film in the display area;
an organic insulating film covering an edge part of the lower electrode and exposing a center part of the lower electrode, the organic insulating film located both in the display area and the frame area;
an organic EL layer covering the center part of the lower electrode;
an upper electrode covering the organic EL layer and the organic insulating film in the display area;
a first inorganic insulating film covering the upper electrode; and
a second inorganic insulating film between the planarizing film and the organic insulating film, wherein
the second inorganic insulating film includes a plurality of openings in the frame area,
the organic insulating film includes a first part and a second part separated from the first part in the frame area,
each of the first part and the second part is separated from the organic insulating film in the display area,
the first part is in contact with the planarization film via one of the plurality of openings of the second inorganic insulating film, and
the second part is in contact with the planarization film via another one of the plurality of openings of the second inorganic insulating film.

16. The display device according to claim 15, wherein
the first inorganic insulating film extends from the display area to the frame area continuously, and
the first inorganic insulating film covers the first part and the second part.

17. The display device according to claim 16, wherein
an upper surface of the first part and an upper surface of the second part are not in contact with any organic material.

18. The display device according to claim 15, wherein
the organic insulating film includes a third part in the frame area separated from the organic insulating film in the display area,
the third part is in contact with the planarization film via still another one of the plurality of openings of the second inorganic insulating film, and
the third part is separated from the first part and is in contact with the second part.

19. The display device according to claim 15, wherein
the organic insulating film includes a third part in the frame area separated from the organic insulating film in the display area,
the third part is in contact with the planarization film via still another one of the plurality of openings of the second inorganic insulating film, and
the third part is separated from both of the first part and the second part.

* * * * *